(12) United States Patent
Zhu et al.

(10) Patent No.: US 10,128,351 B2
(45) Date of Patent: Nov. 13, 2018

(54) SEMICONDUCTOR DEVICES HAVING A GATE CONDUCTOR AND METHODS OF MANUFACTURING THE SAME

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Qingqing Liang, Lagrangeville, NY (US); Huicai Zhong, San Jose, CA (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/389,095

(22) PCT Filed: Oct. 8, 2012

(86) PCT No.: PCT/CN2012/082570
§ 371 (c)(1),
(2) Date: Sep. 29, 2014

(87) PCT Pub. No.: WO2014/043947
PCT Pub. Date: Mar. 27, 2014

(65) Prior Publication Data
US 2015/0054074 A1 Feb. 26, 2015

(30) Foreign Application Priority Data

Sep. 21, 2012 (CN) .......................... 2012 1 0356635

(51) Int. Cl.
*H01L 29/66* (2006.01)
*H01L 29/78* (2006.01)
(Continued)

(52) U.S. Cl.
CPC ...... *H01L 29/6653* (2013.01); *H01L 21/2815* (2013.01); *H01L 21/28141* (2013.01);
(Continued)

(58) Field of Classification Search
CPC ......... H01L 21/28282; H01L 27/11568; H01L 29/6653; H01L 21/28141; H01L 21/2815;
(Continued)

(56) References Cited

U.S. PATENT DOCUMENTS 6,686,282 B1 2/2004 Simpson et al.
7,488,656 B2 * 2/2009 Cartier .............. H01L 21/28079
438/142
(Continued)

FOREIGN PATENT DOCUMENTS

CN 102315269 A 1/2012
CN 102655092 A 9/2012
(Continued)

*Primary Examiner* — Stephen Bradley
*Assistant Examiner* — Patricia Reddington
(74) *Attorney, Agent, or Firm* — Drinker Biddle & Reath LLP

(57) ABSTRACT

Semiconductor devices and methods of manufacturing the same are provided. In one embodiment, the method may include: forming a first shielding layer on a substrate; forming one of source and drain regions with the first shielding layer as a mask; forming a second shielding layer on the substrate, and removing the first shielding layer; forming a shielding spacer on a sidewall of the second shielding layer; forming the other of the source and drain regions with the second shielding layer and the shielding spacer as a mask; removing at least a portion of the shielding spacer; and forming a gate dielectric layer, and forming a gate conductor as a spacer on a sidewall of the second shielding layer or a possible remaining portion of the shielding spacer.

3 Claims, 8 Drawing Sheets

(51) Int. Cl.
*H01L 29/10* (2006.01)
*H01L 29/49* (2006.01)
*H01L 21/28* (2006.01)
*H01L 27/11568* (2017.01)
*H01L 21/8238* (2006.01)
*H01L 29/423* (2006.01)

(52) U.S. Cl.
CPC ........ *H01L 29/105* (2013.01); *H01L 29/4983* (2013.01); *H01L 29/66545* (2013.01); *H01L 29/66636* (2013.01); *H01L 29/66659* (2013.01); *H01L 29/66689* (2013.01); *H01L 29/7816* (2013.01); *H01L 29/7833* (2013.01); *H01L 29/7843* (2013.01); *H01L 21/28079* (2013.01); *H01L 21/823842* (2013.01); *H01L 27/11568* (2013.01); *H01L 29/66598* (2013.01); *H01L 2029/42388* (2013.01)

(58) Field of Classification Search
CPC ............... H01L 29/105; H01L 29/4983; H01L 29/66545; H01L 29/66636; H01L 29/66659; H01L 29/66689; H01L 29/7816; H01L 29/7833; H01L 29/7843
USPC ......................................................... 257/343
See application file for complete search history.

(56) References Cited

U.S. PATENT DOCUMENTS

| | | | |
|---|---|---|---|
| 2005/0048732 | A1 | 3/2005 | Park et al. |
| 2008/0020533 | A1* | 1/2008 | Thei .................. H01L 21/26506 438/286 |
| 2010/0193856 | A1* | 8/2010 | Okuyama ......... H01L 21/28282 257/324 |

FOREIGN PATENT DOCUMENTS

| | | |
|---|---|---|
| CN | 103515233 A | 1/2014 |
| CN | 103545215 A | 1/2014 |
| CN | 102339752 A | 2/2014 |

* cited by examiner

SEMICONDUCTOR DEVICES HAVING A
GATE CONDUCTOR AND METHODS OF
MANUFACTURING THE SAME

CROSS-REFERENCE TO RELATED
APPLICATION(S)

This application is a national phase application of PCT Application No. PCT/CN2012/082570, filed on Oct. 8, 2012, entitled "SEMICONDUCTOR DEVICES AND METHODS OF MANUFACTURING THE SAME," which claims priority to Chinese Application No. 201210356635.6, filed on Sep. 21, 2012. Both the PCT application and the Chinese application are incorporated herein by reference in their entirety.

TECHNICAL FIELD

The present disclosure relates to the semiconductor field, and particularly, to semiconductor devices and methods of manufacturing the same.

BACKGROUND

With continuous scaling down of semiconductor devices, short channel effects are becoming more significant. Thus, a gate stack configuration comprising a high-K gate dielectric and a metal gate conductor is proposed. To avoid degradation of the gate stack, semiconductor devices with such a gate stack configuration are manufactured generally by means of the replacement gate process. The replacement gate process involves filling the high-K dielectric and the metal gate conductor in a gap defined between gate spacers. However, it is becoming more and more difficult to fill the high-K dielectric and the metal gate conductor in the small gap due to the scaling down of the semiconductor devices.

SUMMARY

The present disclosure provides, among others, semiconductor devices and methods of manufacturing the same.

According to an aspect of the present disclosure, there is provided a method of manufacturing a semiconductor device. The method may comprise: forming a first shielding layer on a substrate; forming one of source and drain regions with the first shielding layer as a mask; forming a second shielding layer on the substrate, and removing the first shielding layer; forming a shielding spacer on a sidewall of the second shielding layer; forming the other of the source and drain regions with the second shielding layer and the shielding spacer as a mask; removing at least a portion of the shielding spacer; and forming a gate dielectric layer, and forming a gate conductor as a spacer on a sidewall of the second shielding layer or a possible remaining portion of the shielding spacer.

According to a further aspect of the present disclosure, there is provided a semiconductor device. The device may comprise a substrate, and source and drain regions and a gate stack formed on the substrate. The source and drain regions may comprise an epitaxy layer at least partially embedded in the substrate. The gate stack may comprise a gate dielectric layer, and a gate conductor, which is formed as a spacer on a sidewall of a dielectric layer or a gate spacer on one side of the gate stack.

BRIEF DESCRIPTION OF THE DRAWINGS

The above and other objects, features, and advantages of the present disclosure will become more apparent from following descriptions of embodiments with reference to the attached drawings, in which.

DETAILED DESCRIPTION

Figure 1:
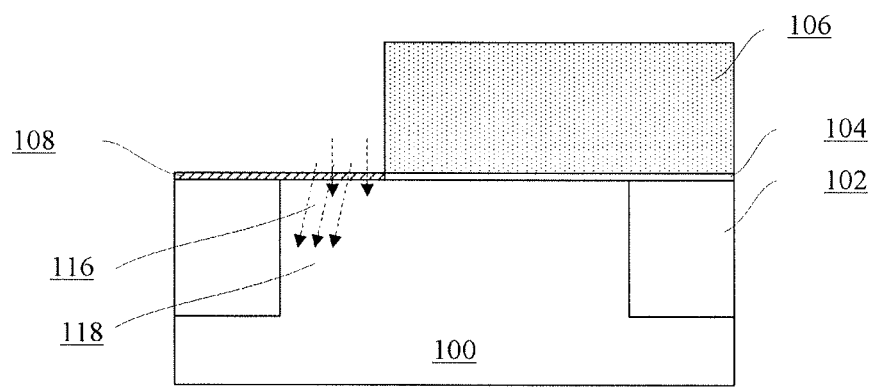
FIGS. 1-8 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

In the conventional process, after source and drain regions are formed in a substrate with the aid of a "dummy" gate stack and spacers on opposite sides of the dummy gate stack, the spacers are reserved to define a gap therebetween, and a true gate stack can be formed by filling the gap. In contrast, the present disclosure proposes a "replacement spacer" process. Specifically, after source and drain regions are formed, material layer(s) present on the side of either one of the source and drain regions is (are) reserved, and a gate stack (particularly, a gate conductor) is formed as a spacer on a sidewall of the reserved material layer(s). In this way, formation of the gate stack is done in a relatively large space (substantially corresponding to a gate region+the other of the source and drain regions). This process is easier to perform as compared with the conventional process where formation of the gate stack is done in the small gap between the spacers.

The technology of the present disclosure can be implemented in various ways, some of which will be described in the following by way of example.

Firstly, a flow of manufacturing a semiconductor device according to an embodiment of the present disclosure is described with reference to FIGS. 1-8.

As shown in FIG. 1, a substrate 100 is provided. The substrate 100 may comprise any suitable substrate, including, but not limited to, a bulk semiconductor substrate such as a bulk Si substrate, a Semiconductor On Insulator (SOI)

substrate, a SiGe substrate, or the like. In the following, the substrate is described as a bulk Si substrate for convenience. On the substrate 100, Shallow Trench Isolations (STIs) 102 can be formed to isolate active regions of individual devices. For example, the STIs 102 may comprise oxide (e.g., silicon oxide). In the following, formation of a single one device is described for convenience. However, it is to be noted that the present disclosure is not limited thereto, and is also applicable to formation of two or more devices.

Optionally, a thin oxide layer (e.g., silicon oxide) 104 may be formed on a surface of the substrate 100 by means of e.g. deposition. For example, the oxide layer 104 may have a thickness of about 5-10 nm, and can be used to form an Interfacial Layer (IL) subsequently. On the substrate 100 (or on the oxide layer 104 in the case where the oxide layer 104 is formed), a first shielding layer 106 with a thickness of e.g. about 100-200 nm can be formed by means of e.g. deposition. For example, the first shielding layer 106 may comprise nitride (e.g. silicon nitride). The first shielding layer 106 can be patterned by means of e.g. Reactive Ion Etching (RIE) to expose a portion of the active region (which portion substantially corresponds to a later formed source or drain region).

In the case where the oxide layer 104 is formed, the oxide layer 104 can be selectively etched with respect to the first shielding layer 106 (e.g., nitride) and the substrate 100 (e.g., bulk Si), to form an IL 108 with a thickness of e.g. about 0.5-1 nm. Here, the difference in thickness between the IL 108 and the oxide layer 104 is not shown for convenience of illustration.

Because the first shielding layer 106 exposes the portion of the active region, one of the source and drain regions can be formed in the exposed portion of the active region by means of a source/drain formation process with the first shielding layer 106 as a mask. For example, this can be done as follows.

Specifically, as shown in FIG. 1 (especially, indicated by vertical arrows shown therein), extension implantation can be carried out to form an extension region 116. For example, for a p-type device, the implantation can be done by implanting p-type impurities such as In, $BF_2$ or B; for an n-type device, the implantation can be done by implanting n-type impurities such as As or P, to form the extension region. It is to be noted that the dashed line block 116 in FIG. 1 is shown as a regular rectangular shape for convenience of illustration. In practice, the profile of the extension region 116 depends on the process, and may have no definite boundaries. Further, to improve the performance, halo implantation can be carried out before the extension implantation. For example, for a p-type device, the implantation can be done by implanting n-type impurities such as As or P; for an n-type device, the implantation can be done by implanting p-type impurities such as In, $BF_2$ or B, to form a halo region (not shown).

Then, as indicated by oblique arrows in FIG. 1, angular source/drain implantation can be done to form a source/drain implantation region 118. For example, for a p-type device, the implantation can be done by implanting p-type impurities such as In, $BF_2$ or B; for a n-type device, the implantation can be done by implanting n-type impurities such as As or P, to form the source/drain implantation region. It is to be noted that the dashed line block 118 in FIG. 1 is shown as a regular rectangular shape for convenience of illustration. In practice, the profile of the source/drain implantation region 118 depends on the process, and may have no definite boundaries.

Figure 2:
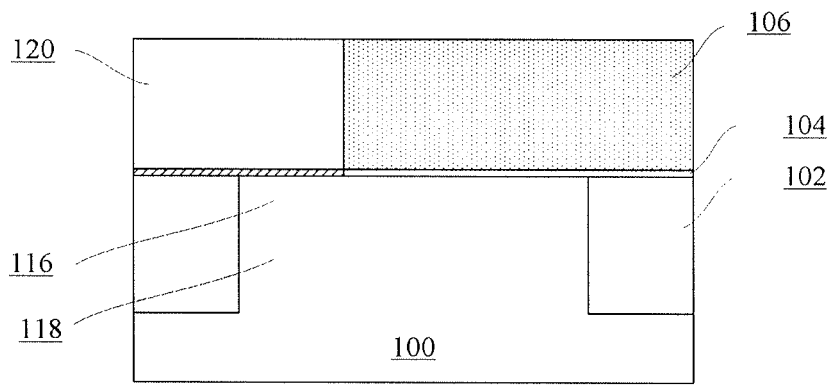

Next, as shown in FIG. 2, a second shielding layer 120 may be formed on the substrate 100, to cover at least the above formed one of the source and drain regions. For example, the second shielding layer 120 may comprise oxide (e.g., silicon oxide). Then, a planarization process such as Chemical Mechanical Polishing (CMP) can be performed to expose the first shielding layer 106 to facilitate following processes.

Figure 3:
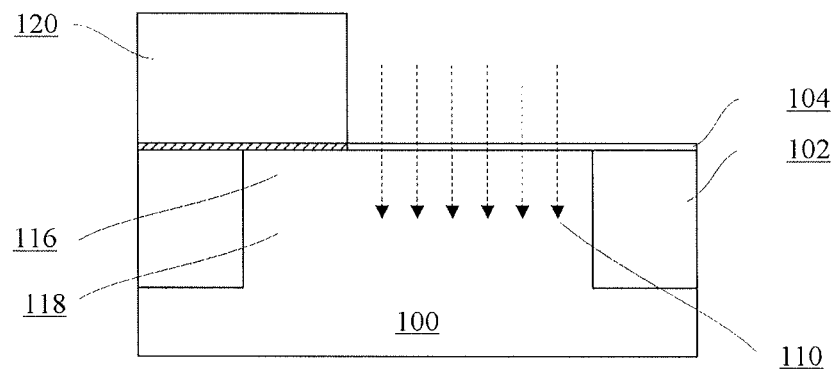

Subsequently, as shown in FIG. 3, the first shielding layer 106 can be removed by selectively etching the first shielding layer 106 (e.g., silicon nitride) with respect to the second shielding layer 120 and the oxide layer 104 (e.g., silicon oxide). The selective etching can be done by hot phosphoric acid, for example.

According to an embodiment, for better control of short channel effects and suppression of band-to-band leakage, a Super-Steep-Retrograded Well (SSRW) 110 can be formed by ion implantation (indicated by arrows) with the second shielding layer 120 as a mask, as shown in FIG. 3. For example, for a p-type device, the implantation can be done by implanting n-type impurities such as As, P, or Sb; for an n-type device, the implantation can be done by implanting p-type impurities such as In, $BF_2$ or B, to form the SSRW. It is to be noted that the dashed line block 110 in FIG. 3 is shown as a regular rectangular shape for convenience of illustration. In practice, the profile of the SSRW 110 depends on the process, and may have no definite boundaries. The SSRW facilitates depletion of channel ions, and thus improving the short channel effects.

Figure 4:
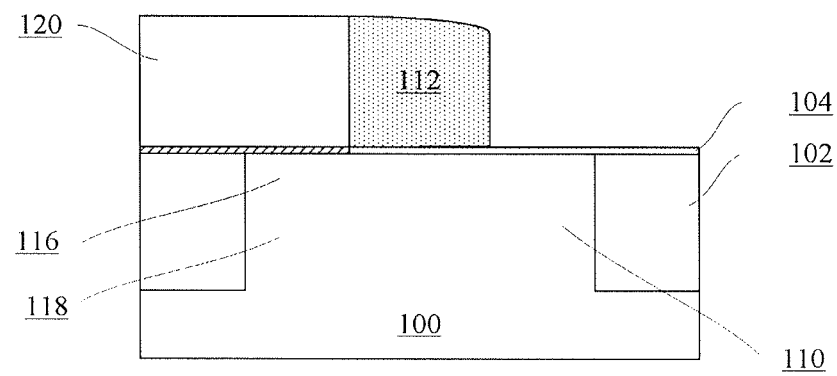

Then, as shown in FIG. 4, a shielding spacer 112 may be formed on a sidewall of the second shielding layer 120. For example, the shielding spacer 112 is formed to have a width of about 8-30 nm to cover a portion of the active region (which portion substantially corresponds to a later formed gate region). The shielding spacer 112 may comprise dielectric such as nitride (e.g., silicon nitride) or polysilicon, for example. In the following, the shielding spacer is described as silicon nitride. However, the present disclosure is not limited thereto.

Thus, as shown in FIG. 4, the second shielding layer 120 and the shielding spacer 112 expose a portion of the active region. Then, the other of the source and drain regions can be formed in the exposed portion of the active region by means of a source/drain formation process with the second shielding layer 120 and the shielding spacer 112 as a mask. For example, this can be done as follows.

Figure 5:
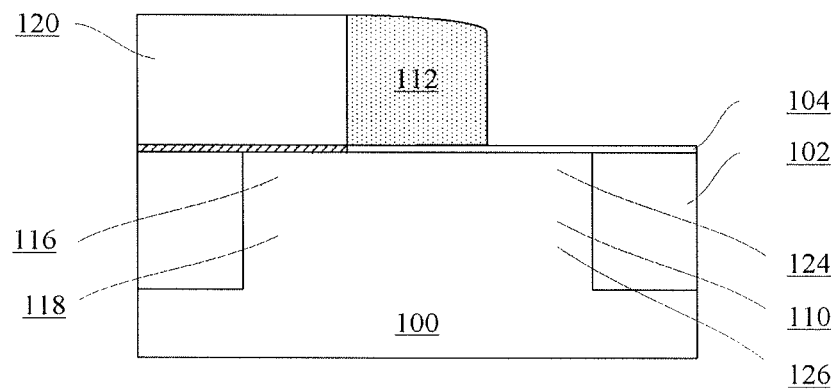

Specifically, as shown in FIG. 5, extension implantation can be carried out to form an extension region 124. Further, to improve the performance, halo implantation can be carried out before the extension implantation to form a halo region (not shown). After that, angular source/drain implantation can be done to form a source/drain implantation region 126. For more details of these implantations, reference may be made to the above descriptions in conjunction with FIG. 1.

Figure 6:
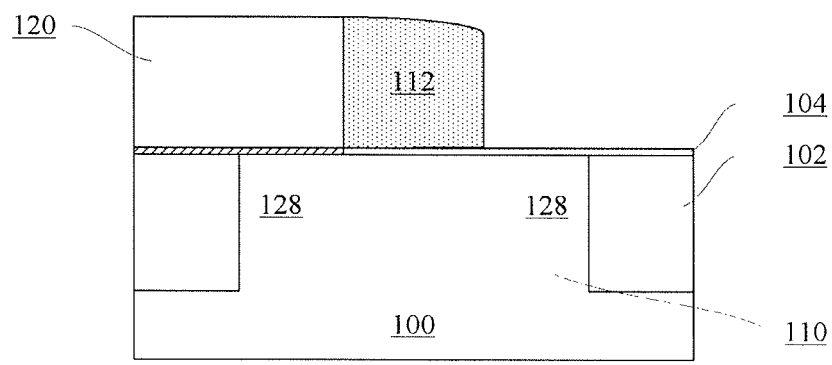

Next, as shown in FIG. 6, annealing, such as spike annealing, laser annealing, and flash annealing, can be performed to activate the implanted impurities, to form final source and drain regions 128.

Then, the shielding spacer 112 can be removed by selective etching. For example, the shielding spacer 112 (e.g., silicon nitride) may be selectively removed by means of hot phosphoric acid. As a result, a relatively large space (substantially corresponding to the gate region+the other of the source and drain regions) is reserved on the side of the second shielding layer 120, so that it is relatively easy to form a gate stack.

Figure 7:
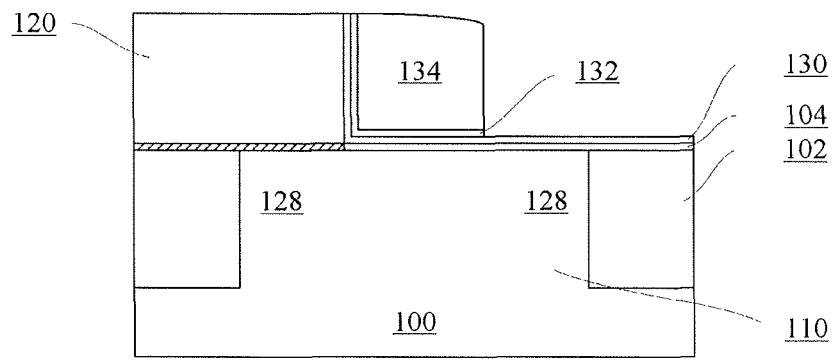

Then, as shown in FIG. 7, the gate stack can be formed. Specifically, a gate dielectric layer 130 can be formed by means of e.g. deposition. For example, the gate dielectric layer 130 may comprise a high-K gate dielectric material such as HfO$_2$, with a thickness of about 2-4 nm. Optionally, an IL can be rebuilt before formation of the gate dielectric layer 130. For example, the IL (not shown) can be formed by selectively etching the oxide layer 104, as described above with reference to FIG. 1. On the gate dielectric layer 130, a gate conductor 134 can be formed as a spacer. In formation of the gate conductor, parameters adopted in the spacer formation process, such as deposition thickness and RIE parameters, can be controlled to locate the gate conductor 134 as a spacer substantially between the underlying source and drain regions formed as described above. For example, the gate conductor 134 may comprise a metal gate conductor material, such as Ti, Co, Ni, Al, W, or any alloy thereof. Further, there may be a work function adjustment layer 132 sandwiched between the gate dielectric layer 130 and the gate conductor 134. For example, the work function adjustment layer 132 may comprise any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, Ni$_3$Si, Pt, Ru, Ir, Mo, HfRu, RuO$_x$, or any combination thereof, with a thickness of about 2-10 nm.

Figure 8:
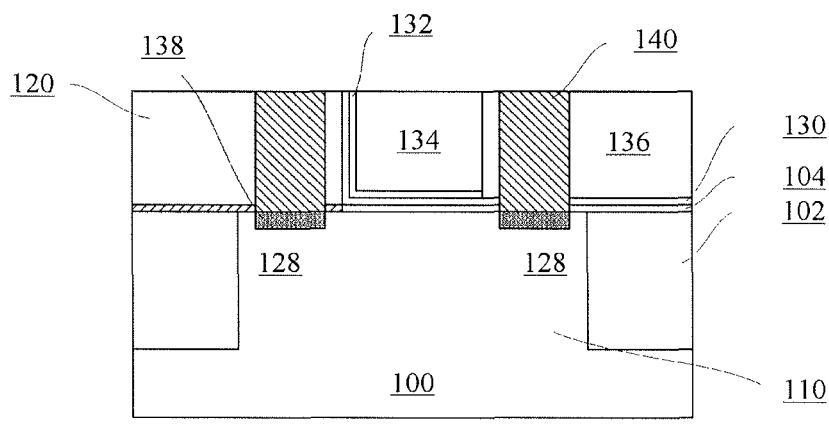

After that, as shown in FIG. 8, a dielectric layer 136 can be formed by means of e.g. deposition, and planarized by means of e.g., CMP. The dielectric layer 136 may comprise oxide (e.g., silicon oxide), nitride or any combination thereof. Further, contacts 140 corresponding to the source and drain regions may be formed. For example, the contacts 140 may comprise metal such as W, Cu, or the like. According to an embodiment, to improve contact, a metal silicide layer 138 may be formed on the source and drain regions, so that the contacts 140 electrically contact the source and drain regions via the metal silicide layer 138. For example, the metal silicide layer 138 may comprise NiPtSi. There are various ways to form the metal silicide layer 138 and the contacts 140, and detailed descriptions thereof are omitted here.

Thus, an illustrative semiconductor device according to the present disclosure is achieved. As shown in FIG. 8, the semiconductor device may comprise the source and drain regions (128) and the gate stack (130, 132, 134) formed on the substrate. The gate stack, especially, the gate conductor 134, is formed as a spacer on the sidewall of the second shielding layer 120. The semiconductor device may comprise the asymmetric SSRW 110 extending in the semiconductor substrate under the gate stack, more specifically, extending away from one of the source and drain regions (the left one in FIG. 8) towards the other of the source and drain regions (the right one in FIG. 8).

It is to be noted that in the above embodiment the shielding spacer 112 is removed in its entirety. Alternatively, a portion of the shielding spacer 112 on the sidewall of the second shielding layer 120 may be left. This portion can serve as a gate spacer for the gate stack.

Next, a flow of manufacturing a semiconductor device according to a further embodiment of the present disclosure is described with reference to FIGS. 9-16. Similar or like reference symbols in FIGS. 9-16 denote similar or like components as those shown in FIGS. 1-8. In the following, descriptions are mainly directed to differences between this embodiment and the above described embodiments.

Figure 9:
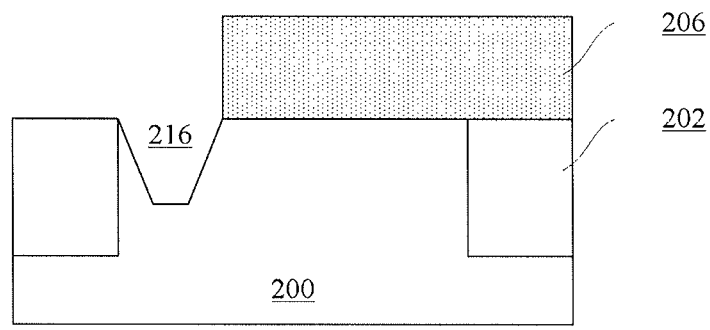
FIGS. 9-16 are schematic views showing a flow of manufacturing a semiconductor device according to a further embodiment of the present disclosure.

As shown in FIG. 9, a substrate 200 is provided. On the substrate 200, STIs 202 can be formed. Optionally, a thin oxide layer (not shown) may be formed on a surface of the substrate 200. For details of the substrate 200 and the oxide layer, reference may be made to the above descriptions on the substrate 100 and the oxide layer 104 in conjunction with FIG. 1.

On the substrate 200, a first shielding layer 206 with a thickness of e.g. about 100-200 nm can be formed by means of e.g. deposition. For example, the first shielding layer 206 may comprise nitride (e.g. silicon nitride). The first shielding layer 206 can be patterned by means of e.g. RIE to expose a portion of the active region (which portion substantially corresponds to a later formed source or drain region). Then, one of the source and drain regions can be formed in the exposed portion of the active region by means of a source/drain formation process with the first shielding layer 206 as a mask. For example, this can be done as follows.

Specifically, an opening 216 may be etched into the substrate 200 by selective etching with the first shielding layer 206 as a mask. The selective etching may be done by anisotripically etching the substrate 200 (e.g., Si) by a TMAH solution.

Figure 10:
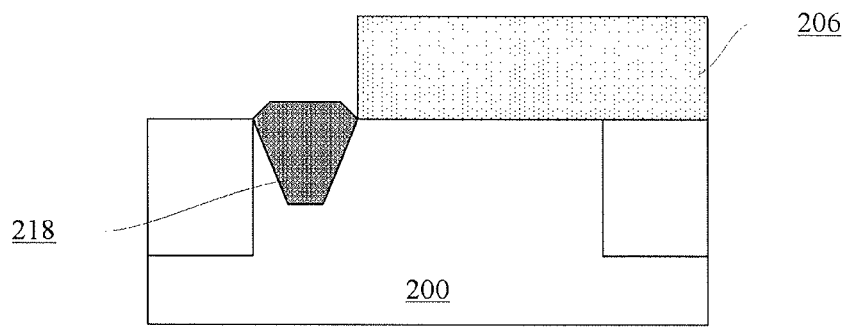

Then, as shown in FIG. 10, the one of the source and drain regions 218 may be formed in the opening 216 by means of, e.g., epitaxy. For example, the one of the source and drain regions 218 may comprise a different semiconductor material from that of the substrate 200, and thus can apply stress to a channel region to be formed in the substrate 200 due to, for example, a difference in lattice constant therebetween. For a p-type device, the source/drain region 218 may apply compressive stress; for an n-type device, the source/drain region 218 may apply tensile stress. For example, in the case where the substrate 200 comprises Si, the source/drain region 218 may comprise SiGe (where an atomic percentage of Ge may be about 15-75%) for the p-type device, or Si:C (where an atomic percentage of C may be about 0.2-2%) for the n-type device. The source/drain region 218 may be doped in-situ in a proper conductivity during epitaxy.

Figure 11:
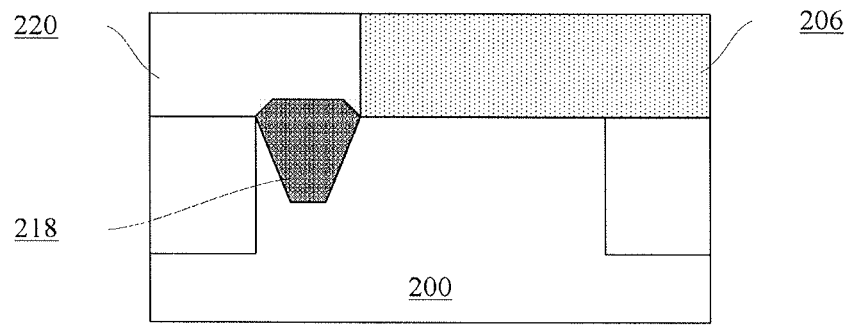

Next, as shown in FIG. 11, a second shielding layer 220 may be formed on the substrate 200. For example, the second shielding layer 220 may comprise oxide (e.g., silicon oxide). Then, a planarization process such as CMP can be performed to expose the first shielding layer 206 to facilitate following processes.

Figure 12:
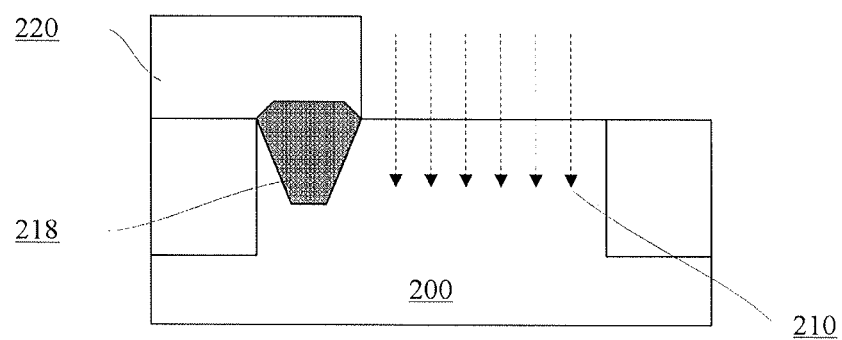

Subsequently, as shown in FIG. 12, the first shielding layer 206 can be removed by selectively etching the first shielding layer 206 (e.g., silicon nitride) with respect to the second shielding layer 220 (e.g., silicon oxide). For example, the selective etching can be done by wet etching (with, e.g., hot phosphoric acid) or a combination of wet etching and RIE.

According to an embodiment, for better control of short channel effects and suppression of band-to-band leakage, a Super-Steep-Retrograded Well (SSRW) 210 can be formed by ion implantation (indicated by arrows) with the second shielding layer 220 as a mask, as shown in FIG. 12. For details of the SSRW 210, reference may be made to the above descriptions in conjunction with FIG. 3. Then, implanted impurities can be activated by annealing, such as spike annealing, laser annealing, and flash annealing.

Figure 13:
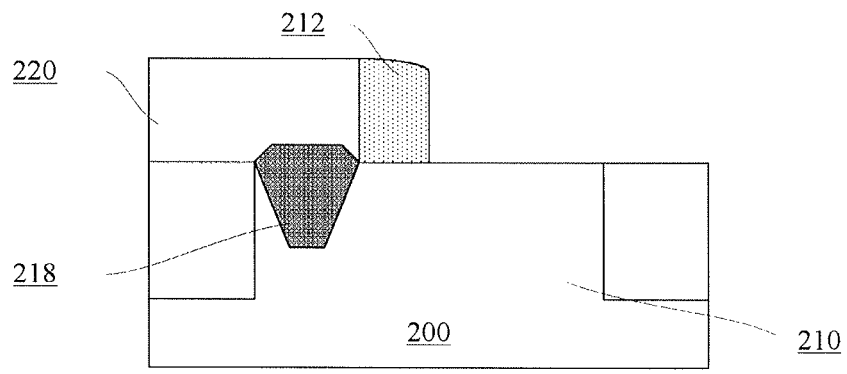
Figure 14:
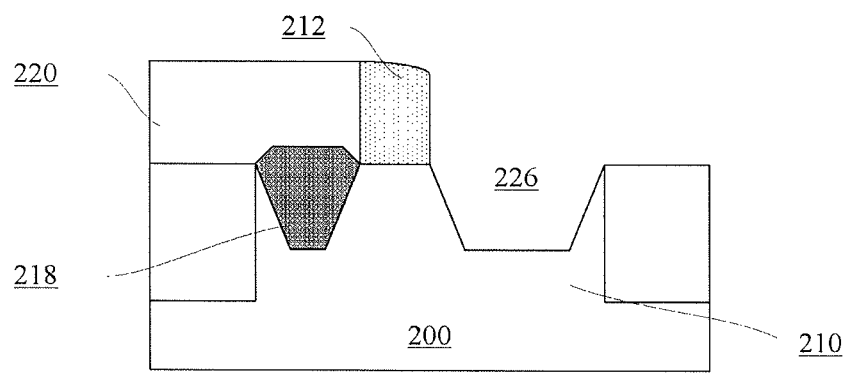

Then, as shown in FIG. 13, a shielding spacer 212 can be formed on a sidewall of the second shielding layer 220. For example, the shielding spacer 212 is formed to have a width of about 8-30 nm to cover a portion of the active region (which portion substantially corresponds to a later formed gate region). The shielding spacer 212 may comprise dielectric such as nitride (e.g., silicon nitride), for example. There are various ways to form the shielding spacer, and detailed descriptions on formation of the shielding spacer are omitted here.

Thus, the second shielding layer 220 and the shielding spacer 212 expose a portion of the active region. Then, the other of the source and drain regions can be formed in the exposed portion of the active region by means of a source/drain formation process with the second shielding layer 220 and the shielding spacer 212 as a mask. For example, this can be done as follows.

Specifically, an opening 226 may be etched into the substrate 200 by selectively etching the substrate 200 with the second shielding layer 220 and the shielding spacer 212 as a mask. The selective etching may be done by anisotripically etching the substrate 200 (e.g., Si) by a TMAH solution.

Figure 15:
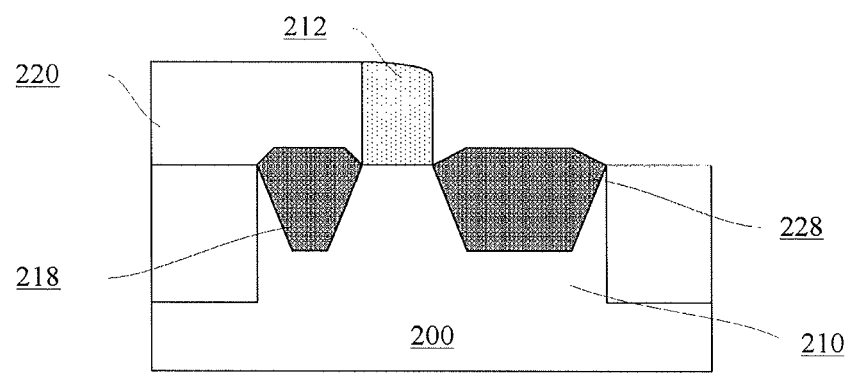

Then, as shown in FIG. 15, the other of the source and drain regions 228 may be formed in the opening 226 by means of, e.g., epitaxy. For example, the source/drain regions 228 may comprise a different semiconductor material from that of the substrate 200, and thus can apply stress to the channel region to be formed in the substrate 200 due to, for example, a difference in lattice constant therebetween. For a p-type device, the source/drain region 228 may apply compressive stress; for an n-type device, the source/drain region 228 may apply tensile stress. For example, in the case where the substrate 200 comprises Si, the source/drain region 228 may comprise SiGe (where an atomic percentage of Ge may be about 15-75%) for the p-type device, or Si:C (where an atomic percentage of C may be about 0.2-2%) for the n-type device. The source/drain region 228 may be doped in-situ in a proper conductivity during epitaxy.

Then, at least a portion of the shielding spacer 212 can be removed by selective etching. For example, the shielding spacer 212 (e.g., silicon nitride) may be selectively removed by means of hot phosphoric acid. As a result, a relatively large space (substantially corresponding to the gate region+ the other of the source and drain regions) is reserved on the side of the second shielding layer 220, so that it is relatively easy to form a gate stack.

Figure 16:
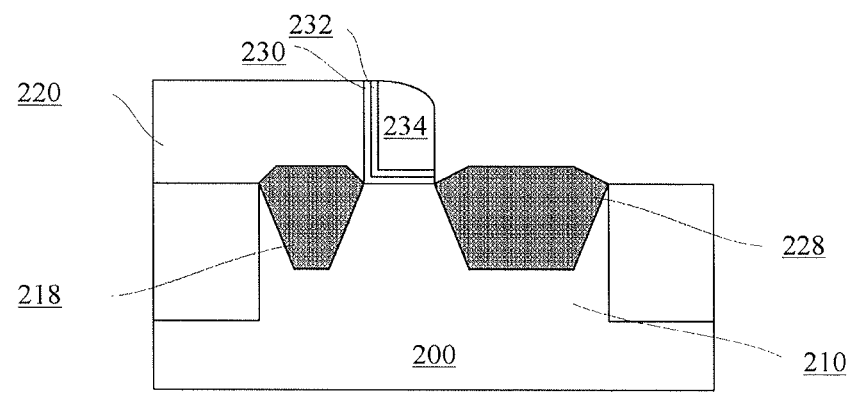

Then, as shown in FIG. 16, the gate stack can be formed. Specifically, a gate dielectric layer 230 can be formed by means of e.g. deposition. On the gate dielectric layer 230, a gate conductor 234 can be formed as a spacer. In formation of the gate conductor, parameters adopted in the spacer formation process, such as deposition thickness and RIE parameters, can be controlled, so that the gate conductor 234 as a spacer has a width of about 10-35 nm, and thus is located substantially between the underlying source and drain regions formed as described above. Further, there may be a work function adjustment layer 232 sandwiched between the gate dielectric layer 230 and the gate conductor 234. The gate dielectric layer 230 and the work function adjustment layer 232 shown in FIG. 16 are resultant structures from selectively etching them with the gate conductor 234 as a mask. For more details of the gate dielectric layer 230, the work function layer 232, and the gate conductor 234, reference may be made to the above descriptions in conjunction with FIG. 7.

After that, a dielectric layer can be deposited and planarized, and peripheral components such as contacts can be formed. Detailed descriptions thereof are omitted here.

Though the above descriptions in conjunction with the embodiment shown in FIGS. 9-16 do not involve an IL, operations for forming the IL can be done as described in the above embodiments.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A semiconductor device, comprising:
  a substrate; and
  a source region and a drain region and also a gate stack formed on the substrate, wherein the source region and the drain region are located on the opposite sides of the gate stack, respectively, and wherein each of the source region and the drain region comprises an epitaxial layer at least partially embedded in the substrate,
  wherein the gate stack comprises:
    a gate dielectric layer, which is formed on a sidewall of a dielectric layer or on a sidewall of a gate spacer on one side of the gate stack and is in an "L" shape;
    a work function adjustment layer formed on the gate dielectric layer and is in an "L" shape; and
    a gate conductor, which is formed on the work function adjustment layer, and
  wherein an edge of one of the source region and the drain region is located directly under a vertical portion of the L-shaped gate dielectric layer and approximately aligned with one side of the gate conductor, and an edge of the other one of the source region and the drain region is approximately aligned with the other side of the gate conductor.

2. The semiconductor device according to claim 1, further comprising a super-steep-retrograded well formed in the substrate, which extends away from one of the source region and the drain region towards the other of the source region and the drain region.

3. The semiconductor device according to claim 1, wherein an extent from a sidewall of the gate dielectric layer facing away from the gate conductor to a sidewall of the gate conductor on an opposite side to said one side is equal to or greater than a distance between the source region and the drain region.

* * * * *